United States Patent
Sagara et al.

(10) Patent No.: US 9,811,078 B2
(45) Date of Patent: Nov. 7, 2017

(54) METHOD FOR PROVIDING INSTRUCTION ON SETUP CHANGEOVER WORK IN COMPONENT MOUNTING SYSTEM, AND COMPONENT MOUNTING SYSTEM

(71) Applicant: PANASONIC CORPORATION, Osaka (JP)

(72) Inventors: Hiroki Sagara, Yamanashi (JP); Takuya Yamazaki, Yamanashi (JP); Hirokazu Takehara, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 586 days.

(21) Appl. No.: 14/295,508

(22) Filed: Jun. 4, 2014

(65) Prior Publication Data

US 2015/0039115 A1 Feb. 5, 2015

(30) Foreign Application Priority Data

Jul. 30, 2013 (JP) .................................. 2013-157374

(51) Int. Cl.
*G06F 19/00* (2011.01)
*G05B 19/418* (2006.01)

(52) U.S. Cl.
CPC ........ *G05B 19/41865* (2013.01); *Y02P 90/04* (2015.11); *Y02P 90/20* (2015.11)

(58) Field of Classification Search
CPC ..... G05B 19/41865; Y02P 90/04; Y02P 90/20
USPC ........................................................ 700/106
See application file for complete search history.

(56) References Cited

U.S. PATENT DOCUMENTS

| | | | | |
|---|---|---|---|---|
| 7,155,303 | B2 * | 12/2006 | Sagasaki | ............ G05B 19/4093 |
| | | | | 700/173 |
| 7,801,634 | B2 * | 9/2010 | Kurata | ............. G05B 19/41865 |
| | | | | 29/739 |
| 2003/0060904 | A1 * | 3/2003 | Szoke | .............. G05B 19/41865 |
| | | | | 700/51 |

FOREIGN PATENT DOCUMENTS

| | | |
|---|---|---|
| JP | 10-224081 A | 8/1998 |
| JP | 2008-066405 A | 3/2008 |
| JP | 2008-243890 A | 10/2008 |
| JP | 2011-199217 A | 10/2011 |
| JP | 2012-023112 A | 2/2012 |

* cited by examiner

*Primary Examiner* — Ziaul Karim
(74) *Attorney, Agent, or Firm* — Pearne & Gordon LLP

(57) ABSTRACT

A component mounting system derives work instruction information defining setup changeover work necessary to change an arrangement state of parts feeders from a current arrangement state to a first arrangement state for producing a first substrate type based on current feeder arrangement information corresponding to the current arrangement state and first feeder arrangement information corresponding to the first arrangement state. The work instruction information includes a plurality of pieces of unit work information. Each of the pieces of the unit work information includes kind information indicating a kind of execution operation and feeder state information indicating states before and after execution of work on the parts feeder targeted in the setup changeover work. The pieces of unit work information are displayed on the display screen so as to be arranged in work sequence to be executed.

4 Claims, 6 Drawing Sheets

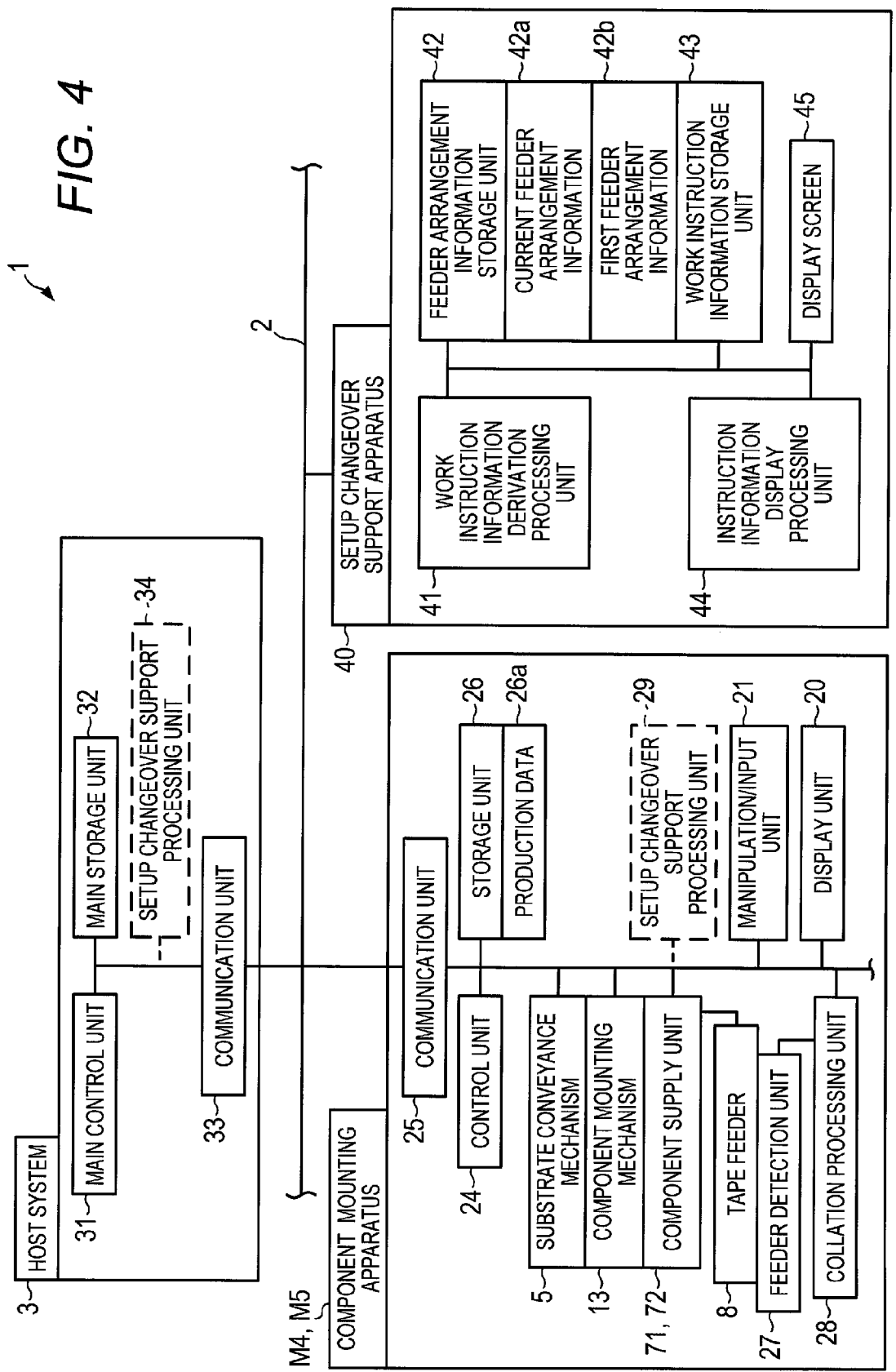

FIG. 5

| WORK INSTRUCTION INFORMATION 50 | | | | | | | |
|---|---|---|---|---|---|---|---|
| WORK SEQUENCE | OPERATION KIND | CURRENT STATE | | NEXT PRODUCTION | COMPONENT NAME | REEL | NUMBER OF NECESSARY COMOPONENTS | COMMENT |
| 1 | DETACHMENT | 1-13R | ⇧ | REUSE | P1005A | P0802S | 500 | |
| 2 | MOVEMENT | 1-14L | ⇧ | 1-2L | P1005A | P0802S | 2500 | |
| 3 | DETACHMENT | 1-14R | ⇧ | REUSE | P1005A | P0802S | 150 | |
| 4 | DETACHMENT | 1-15L | ⇧ | REUSE | P1005B | P0802S | 25000 | |
| 5 | DETACHMENT | 1-15R | ⇧ | REUSE | P1005C | P0802S | 200 | |
| 6 | ATTACHMENT | NEW | ⇧ | 1-4L | P1005C | P0802S | 1500 | |
| 7 | ATTACHMENT | NEW | ⇧ | 1-5L | P1005C | P0802S | 1500 | |
| 8 | ATTACHMENT | NEW | ⇧ | 1-6L | P1005B | P0802S | 1500 | |
| 9 | ATTACHMENT | NEW | ⇧ | 1-7L | P1005B | P0802S | 1500 | |
| 10 | ATTACHMENT | NEW | ⇧ | 1-8L | P1005D | P0802S | 1500 | |
| 11 | ATTACHMENT | NEW | ⇧ | 1-10L | P1005D | P0802S | 1500 | |
| 12 | ATTACHMENT | NEW | ⇧ | 1-13L | P1005D | P0802S | 1500 | |
| 13 | ATTACHMENT | NEW | ⇧ | 1-14L | P1005D | P0802S | 1500 | |

FIG. 6A

| WORK SEQUENCE | OPERATION KIND | CURRENT STATE | | NEXT PRODUCTION | COMPONENT NAME | REEL | NUMBER OF NECESSARY COMOPONENTS | COMMENT |
|---|---|---|---|---|---|---|---|---|
| 1 | DETACHMENT | 1-13R | ⇒ | REUSE | P1005A | | | |
| 2 | MOVEMENT | 1-14L | ⇒ | 1-2L | P1005A | | | |
| 3 | DETACHMENT | 1-14R | ⇒ | REUSE | P1005A | | | |
| 4 | DETACHMENT | 1-15L | ⇒ | REUSE | P1005B | | | |
| 5 | DETACHMENT | 1-15R | ⇒ | REUSE | P1005C | | | |
| 6 | ATTACHMENT | NEW | ⇒ | 1-4L | P1005C | P0802S | 1500 | |
| 7 | ATTACHMENT | NEW | ⇒ | 1-5L | P1005C | P0802S | 1500 | |
| 8 | ATTACHMENT | NEW | ⇒ | 1-6L | P1005B | P0802S | 1500 | |
| 9 | ATTACHMENT | NEW | ⇒ | 1-7L | P1005B | P0802S | 1500 | |
| 10 | ATTACHMENT | NEW | ⇒ | 1-8L | P1005D | P0802S | 1500 | |
| 11 | ATTACHMENT | NEW | ⇒ | 1-10L | P1005D | P0802S | 1500 | |
| 12 | ATTACHMENT | NEW | ⇒ | 1-13L | P1005D | P0802S | 1500 | |
| 13 | ATTACHMENT | NEW | ⇒ | 1-14L | P1005D | P0802S | 1500 | |

FIG. 6B

| WORK SEQUENCE | OPERATION KIND | CURRENT STATE | | NEXT PRODUCTION | COMPONENT NAME | REEL | NUMBER OF NECESSARY COMOPONENTS | COMMENT |
|---|---|---|---|---|---|---|---|---|
| 1 | DETACHMENT | 1-13R | ⇒ | REUSE | P1005A | | | |
| 2 | MOVEMENT | 1-14L | ⇒ | 1-2L | P1005A | | | |
| 3 | DETACHMENT | 1-14R | ⇒ | REUSE | P1005A | | | |
| 4 | DETACHMENT | 1-15L | ⇒ | REUSE | P1005B | | | |
| 5 | DETACHMENT | 1-15R | ⇒ | REUSE | P1005C | | | |
| 6 | ATTACHMENT | REUSE | ⇒ | 1-4L | P1005C | P0802S | 1500 | |
| 7 | ATTACHMENT | REUSE | ⇒ | 1-5L | P1005C | P0802S | 1500 | |
| 8 | ATTACHMENT | NEW | ⇒ | 1-6L | P1005B | P0802S | 1500 | |
| 9 | ATTACHMENT | NEW | ⇒ | 1-7L | P1005B | P0802S | 1500 | |
| 10 | ATTACHMENT | NEW | ⇒ | 1-8L | P1005D | P0802S | 1500 | |
| 11 | ATTACHMENT | NEW | ⇒ | 1-10L | P1005D | P0802S | 1500 | |
| 12 | ATTACHMENT | NEW | ⇒ | 1-13L | P1005D | P0802S | 1500 | |
| 13 | ATTACHMENT | NEW | ⇒ | 1-14L | P1005D | P0802S | 1500 | |

METHOD FOR PROVIDING INSTRUCTION ON SETUP CHANGEOVER WORK IN COMPONENT MOUNTING SYSTEM, AND COMPONENT MOUNTING SYSTEM

BACKGROUND

1. Technical Field

An aspect of the present invention relates to a method for providing an instruction on setup changeover work executed for changing a type of substrate to be produced in a component mounting system which produces a mounting substrate by mounting an electronic component on a substrate. Another aspect of the present invention relates to the component mounting system.

2. Background Art

In a component supply unit of a component mounting apparatus arranged in a component mounting system, a plurality of parts feeders such as tape feeders are provided for different types of components. In a case in which a plurality of types of substrates are produced, since a necessary component type differs depending on a substrate type to be produced, a setup changeover work is required when the substrate type to be produced is changed. The setup changeover work includes changing arrangement of the already arranged parts feeder, adding a new parts feeder, etc., in order to supply components necessary to produce a new type of substrate. The setup changeover work involves complicated contents in which many substrate types or component types are targeted. Therefore, a worker is obliged to execute complicated work of handling individual parts feeders while checking a work instruction table previously created. For the purpose of efficiency of the setup changeover work, various proposals are made for supporting a worker by displaying various pieces of auxiliary information on a display screen provided on a component mounting apparatus (for example, see JP-A-2011-199217 and JP-A-2012-23112).

JP-A-2011-199217 describes a guide display for a worker which indicates, during execution of production of the current substrate type, whether a feeder used in production of the current substrate type supports a component type used in the next production. In JP-A-2012-23112, the substrate type data of current production are compared with the substrate type data of next production to create guideline data for feeder arrangement work for the next substrate type, and the created guideline data are displayed on a screen for a worker during production of the current substrate. In both of the related-art examples, it is possible to prepare setup changeover work for the next substrate type during execution of production of the current substrate type. Consequently, work efficiency can be improved.

SUMMARY

In the above-described related-art examples, the setup changeover can be prepared before the start of production of the next substrate. Incidentally, the setup changeover work mainly involves attachment, detachment or movement of a feeder. For example, in the setup changeover work, many feeders are detached from the already attached position and are moved to and attached to a new attachment position. Consequently, it becomes very important for a worker to execute work operation in proper work execution sequence in order to improve work efficiency. However, in the related art such as the above-described examples, it is not always easy to exactly recognize the reasonable work execution sequence to execute the work. Particularly, for a low skilled worker in charge of the work, it is difficult to improve work efficiency even when the work is executed according to a displayed guide screen. Therefore, it may be difficult to execute the setup changeover work efficiently and easily at the time of changing a type of product in the related-art component mounting system.

An object of an aspect of the invention is to provide a method for providing an instruction on setup changeover work for changing a type of product in a component mounting system capable of efficiently and easily executing the setup changeover work, and the component mounting system.

In a first aspect, there is provided a method for providing an instruction on setup changeover work executed at changing a type of product in a component mounting system which produces a mounting substrate by mounting an electronic component on a substrate by a component mounting apparatus including a component supply unit in which a plurality of parts feeders for supplying components are arranged, and a component mounting mechanism which picks up the electronic component from the component supply unit and conveys and places the electronic component on the substrate, the method including: deriving work instruction information which defines setup changeover work necessary to change an arrangement state of the parts feeders in the component supply unit from a current arrangement state of the parts feeders currently arranged in the component supply unit to a first arrangement state for a first substrate type scheduled to be produced based on current feeder arrangement information corresponding to the current arrangement state and first feeder arrangement information corresponding to the first arrangement state; and displaying the derived work instruction information on a display screen, wherein the work instruction information includes a plurality of pieces of unit work information, wherein each of the plurality of pieces of the unit work information includes kind information and feeder state information, wherein the kind information indicates a kind of execution operation in the setup changeover work, wherein the feeder state information indicates states before and after execution of work on the parts feeder targeted in the setup changeover work, and wherein the plurality of pieces of unit work information are displayed on the display screen so as to be arranged in work sequence to be executed.

In a second aspect, there is provided a component mounting system which produces a mounting substrate by mounting an electronic component on a substrate by a component mounting apparatus including a component supply unit in which a plurality of parts feeders for supplying components are arranged, and a component mounting mechanism which picks up the electronic component from the component supply unit and conveys and places the electronic component on the substrate, the component mounting system including: a work instruction information deriving unit which derives work instruction information which defines setup changeover work necessary to change an arrangement state of the parts feeders in the component supply unit from a current arrangement state of the parts feeders currently arranged in the component supply unit to a first arrangement state for a first substrate type scheduled to be produced based on current feeder arrangement information corresponding to the current arrangement state and first feeder arrangement information corresponding to the first arrangement state; and an instruction information display unit which displays the derived work instruction information on a display screen, wherein the work instruction information includes a plurality of pieces of unit work information, wherein each of the plurality of pieces of the unit work information includes kind information and feeder state information, wherein the kind information indicates a kind of execution operation in the setup changeover work, wherein the feeder state information indicates states before and after execution of work on the parts feeder targeted in the setup changeover work, and wherein the plurality of pieces of unit work information are displayed on the display screen so as to be arranged in work sequence to be executed.

According to the aspects of the invention, the setup changeover work executed at the time of changing a type of product can be executed efficiently and easily.

BRIEF DESCRIPTION OF THE DRAWINGS

FIG. 4 is a block diagram showing a control system of the component mounting system of the embodiment of the invention;

FIG. 5 is an diagram of work instruction information used in instructions on setup changeover work in the component mounting system of the embodiment of the invention; and FIGS. 6A and 6B are diagrams of work instruction information used in instructions on setup changeover work in the component mounting system of the embodiment of the invention.

DETAILED DESCRIPTION

Figure 1:
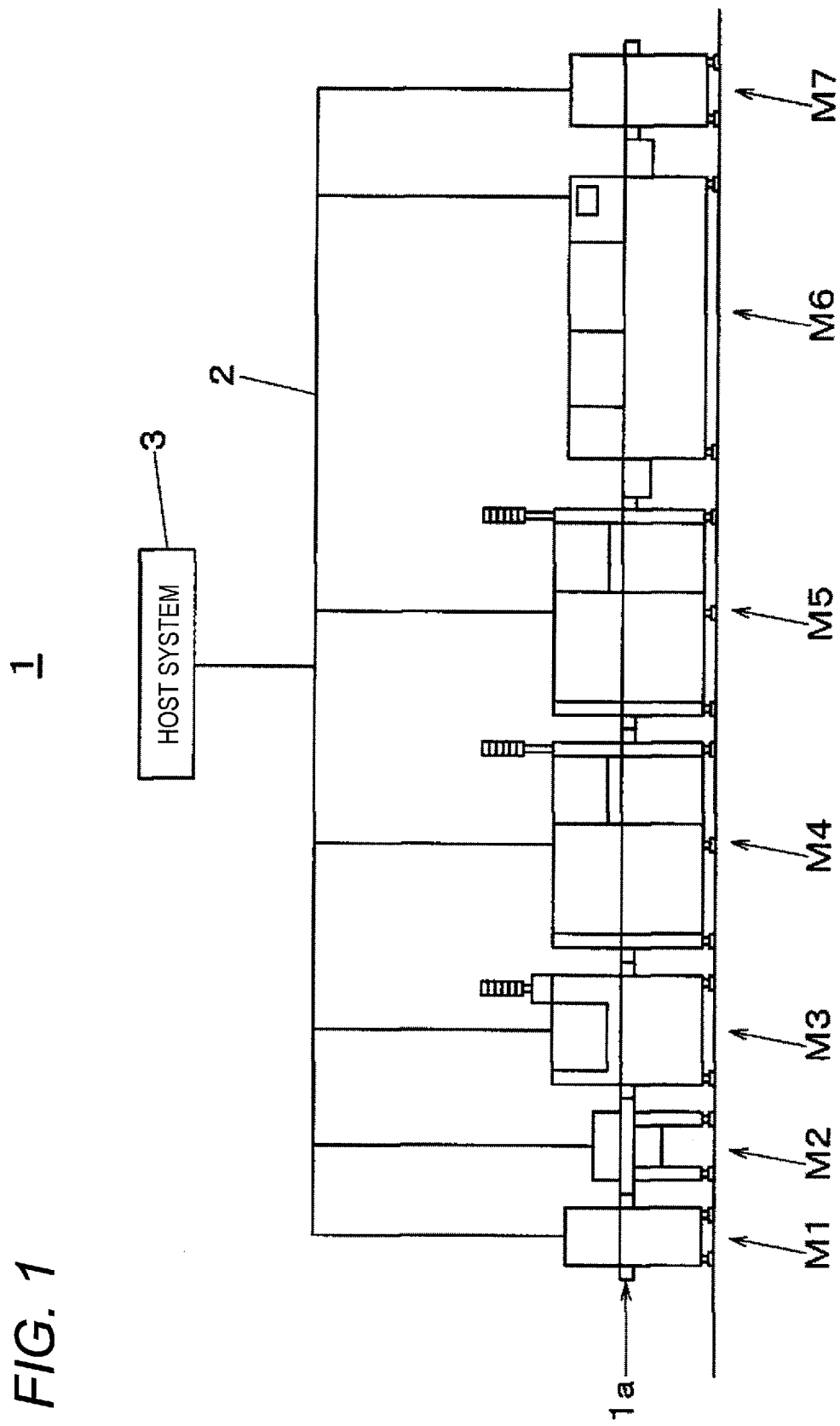
FIG. 1 is a configuration diagram of a component mounting system of an embodiment of the invention.

An embodiment of the invention will be described with reference to the drawings. First, a configuration of a component mounting system 1 will be described with reference to FIG. 1. The component mounting system 1 has a function of producing a mounting substrate by mounting an electronic component on a substrate. The component mounting system 1 is based on a component mounting line 1a formed by serially joining a solder printing apparatus M3, component mounting apparatuses M4, M5 with the same configuration and a reflow apparatus M6 as a plurality of electronic component mounting apparatuses between a substrate supply apparatus M1 and a substrate delivery apparatus M2 and a substrate recovery apparatus M7 having functions of supplying, delivering and recovering the substrate targeted for mounting, respectively.

Each of the substrate supply apparatus M1 to the substrate recovery apparatus M7 is connected to a host system 3 including a management computer through a communication network 2. A substrate conveyance mechanism provided in each of the apparatuses of the component mounting line 1a is joined in series to form a series of substrate conveyance paths. In component mounting work, the work for mounting an electronic component by the solder printing apparatus M3, the component mounting apparatuses M4, M5 and the reflow apparatus M6 is executed on a substrate 6 (see FIG. 2) conveyed along the substrate conveyance paths.

That is, the substrate 6 supplied by the substrate supply apparatus M1 is carried into the solder printing apparatus M3 through the substrate delivery apparatus M2, and solder printing work for executing screen printing of solder for component bonding on the substrate 6 is executed herein.

The substrate 6 after the solder printing is sequentially delivered to the component mounting apparatuses M4, M5, and component mounting work for mounting the electronic component on the substrate 6 after the solder printing is executed herein. Then, the substrate 6 after the component mounting is carried into the reflow apparatus M6 and is herein heated according to a predetermined heating profile, thereby melting and solidifying the solder for component bonding. Accordingly, the electronic component is soldered and bonded to the substrate 6, whereby a mounting substrate including the substrate 6 with the electronic component mounted thereon is completed. The mounting substrate is recovered to the substrate recovery apparatus M7.

Figure 2:
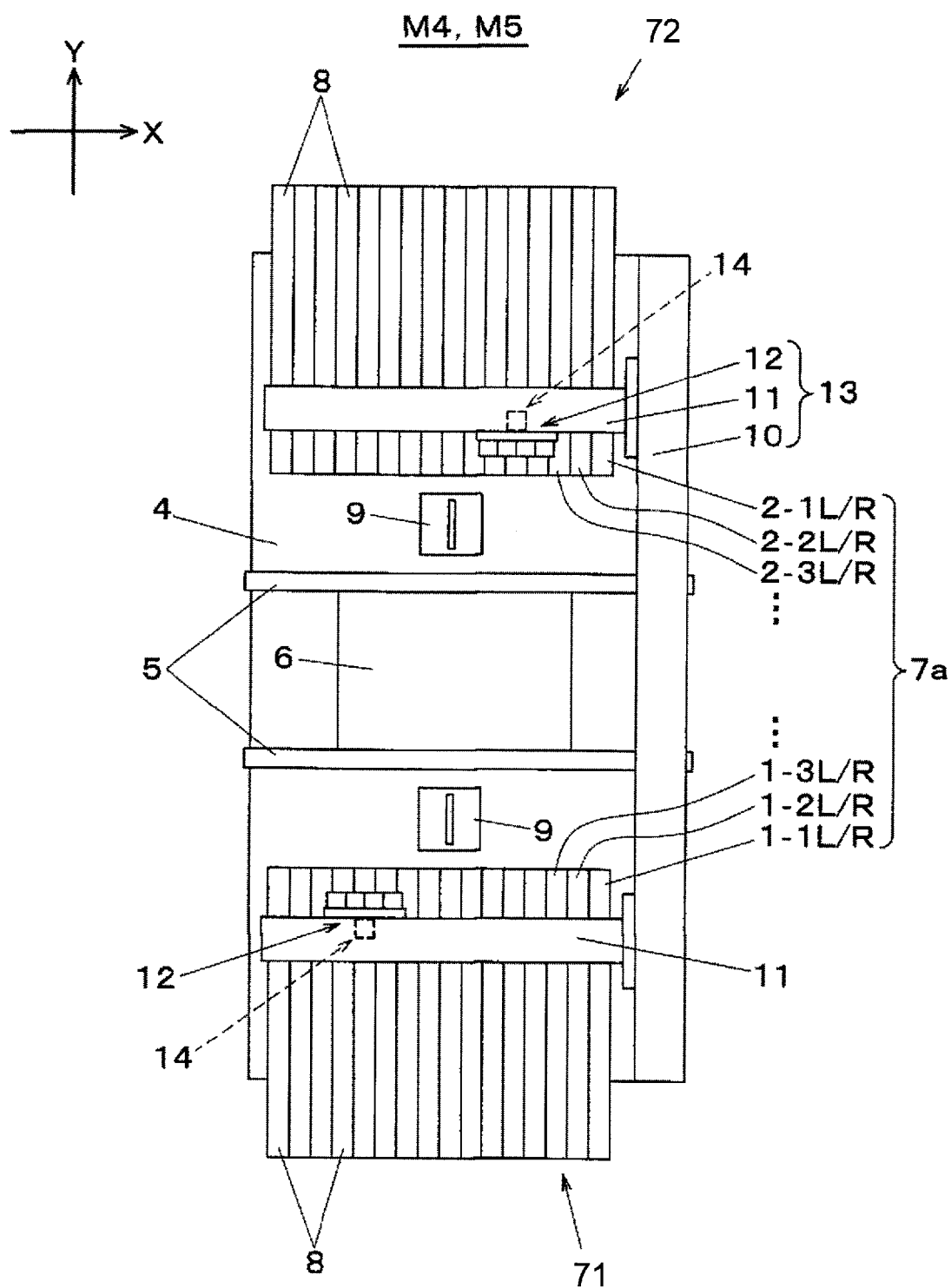
FIG. 2 is a plan view of a component mounting apparatus in the component mounting system of the embodiment of the invention.

Next, a structure of the component mounting apparatuses M4, M5 will be described with reference to FIGS. 2, 3A and 3B. In FIG. 2, a substrate conveyance mechanism 5 is arranged on a base 4 in an X direction. The substrate conveyance mechanism 5 conveys the substrate 6 on which the electronic component is mounted by a conveyor, and positions the substrate 6 in a mounting work position formed on the substrate conveyance mechanism 5.

The front side of the substrate conveyance mechanism 5 is provided with a component supply unit 71 and also the back side of the substrate conveyance mechanism 5 is provided with a component supply unit 72. A plurality of parts feeders for supplying components are arranged and attached to the component supply units 71, 72. The component supply units 71, 72 have feeder addresses 7a for specifying attachment positions of the parts feeders. In the example shown in the embodiment, as the feeder addresses 7a in the component supply unit 71, 1-1L/R, 1-2L/R, 1-3L/R, . . . are set from the downstream side (right side in FIG. 2) toward the upstream side. The parts feeders attached to the component mounting apparatus can be individually identified by specifying the feeder addresses 7a.

Similarly, as the feeder addresses 7a in the component supply unit 72, 2-1L/R, 2-2L/R, 2-3L/R, . . . are set from the downstream side (right side in FIG. 2) toward the upstream side. In addition, a method for setting sequence in the feeder addresses 7a is arbitrarily selected, and address sequence of the component supply units 71, 72 may be set in reverse.

As an example of the parts feeders, the embodiment illustrates tape feeders 8 having a function of pitch feeding of a carrier tape for holding an electronic component to be mounted. By driving the tape feeders 8, the electronic component is supplied in a component suction position by a suction nozzle 12a (see FIG. 3B) of a mounting head 12 described below.

A Y-axis movement table 10 including a linear driving mechanism is arranged in the end of one side in the X direction on an upper surface of the base 4, and two X-axis movement tables 11 including linear driving mechanisms similarly are coupled to the Y-axis movement table 10 movably in a Y direction. The mounting heads 12 are respectively attached to the two X-axis movement tables 11 movably in the X direction. The mounting head 12 is a multiple type head including a plurality of holding heads, and the suction nozzle 12a capable of sucking and holding and individually moving upwardly and downwardly the electronic component is attached to the lower end of each of the holding heads.

The mounting head 12 is moved in the X direction and the Y direction by driving the Y-axis movement table 10 and the X-axis movement table 11. Accordingly, the two mounting heads 12 pick up the electronic components from the component suction positions of the tape feeders 8 of the corresponding component supply units 71, 72 by the suction nozzles 12a, and convey and place the electronic components in mounting points of the substrate 6 positioned in the substrate conveyance mechanism 5. The Y-axis movement table 10, the X-axis movement tables 11 and the mounting heads 12 form a component mounting mechanism 13 for picking up the electronic components from the component supply units 71, 72 and conveying and placing the electronic components on the substrate 6 by moving the mounting heads 12 for holding the electronic components.

Component recognition cameras 9 are arranged between the component supply units 71, 72 and the substrate conveyance mechanism 5. When the mounting head 12 picks up the electronic component from the component supply unit 71, 72 is moved over the component recognition camera 9, the component recognition camera 9 images and recognizes the electronic component with the electronic component held in the mounting head 12. A substrate recognition camera 14 is attached to each of the mounting heads 12. The substrate recognition camera 14 is positioned in the lower surface side of the X-axis movement table 11, and is moved integrally to the mounting head 12. By moving the mounting head 12, the substrate recognition camera 14 is moved over the substrate 6 positioned in the substrate conveyance mechanism 5, and images and recognizes the substrate 6. In component mounting operation to the substrate 6 by the mounting head 12, a placement position correction is made by adding a recognition result of the electronic component by the component recognition camera 9 to a recognition result of the substrate by the substrate recognition camera 14.

Figure 3A:
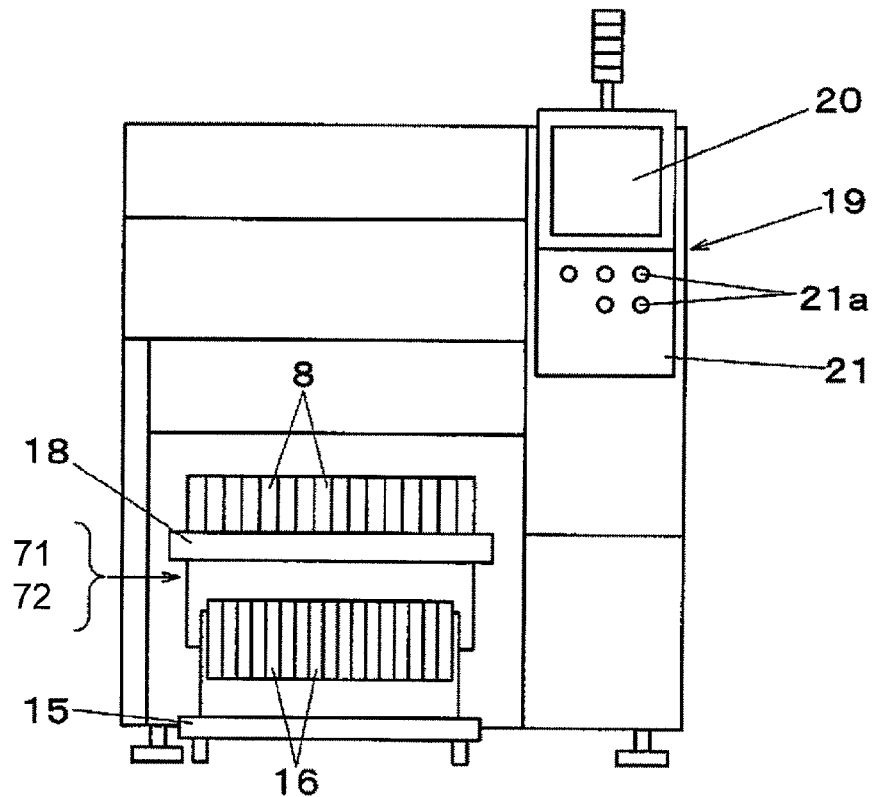
FIGS. 3A and 3B are configuration diagrams of a component supply unit in the component mounting apparatus of the embodiment of the invention.
Figure 3B:
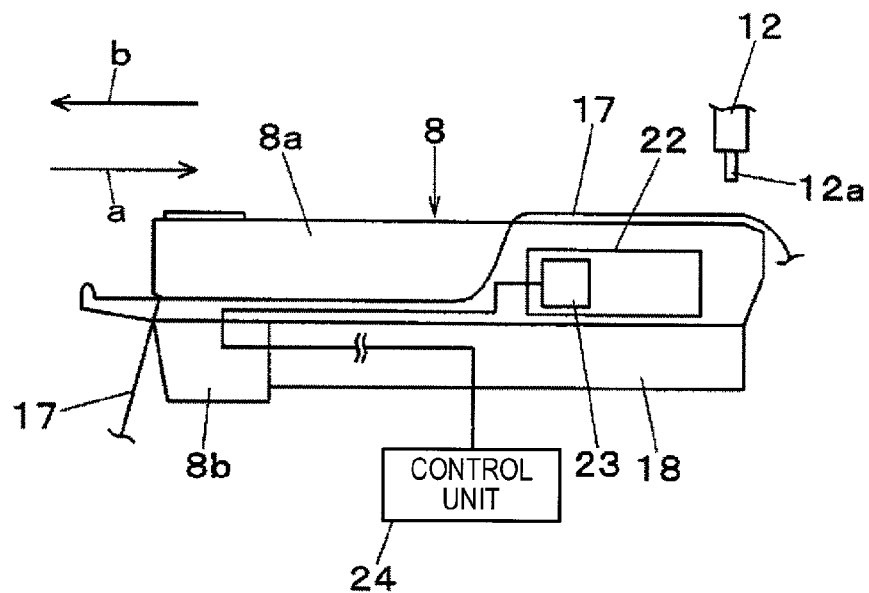

FIG. 3A shows an apparatus manipulation surface of the component mounting apparatuses M4, M5 in a state in which the component supply units 71, 72 are exposed. The plurality of tape feeders 8 are previously attached to a feeder base 18 in a cart 15. The cart 15 in this state is set in the component supply units 71, 72 such that the feeder base 18 is clamped by a clamp mechanism (not shown), whereby a position of the cart 15 is fixed in the component supply units 71, 72. A plurality of supply reels 16 for accommodating a carrier tape 17 holding the electronic components in a wound state are held in the cart 15.

The apparatus manipulation surface is provided with a manipulation unit 19 including a display unit 20 and a manipulation/input unit 21, and manipulation buttons 21a for executing various manipulation inputs are arranged in the manipulation/input unit 21. The display unit 20 is a display device such as a liquid crystal panel, and displays various screens such as a guide screen for executing a manipulation input by the manipulation/input unit 21. The screens include work instruction information used in instructions on setup changeover work involved in change of a type of product.

A configuration and a function of the tape feeder 8 will be described with reference to FIG. 3B. The tape feeder 8 includes a body portion 8a and an attachment portion 8b downwardly protruding from a lower surface of the body portion 8a. The "attachment" operation of attaching the tape feeder 8 to the feeder base 18 is executed by applying the lower surface of the body portion 8a to the feeder base 18 and sliding the tape feeder 8 in a direction of arrow a. Also, the "detachment" operation of detaching the tape feeder 8 from the feeder base 18 is executed by sliding the tape feeder 8 in a direction of arrow b from this state.

In a state in which the tape feeder 8 is attached, a connector portion formed on the attachment portion 8b is fitted into the feeder base 18. Accordingly, the tape feeder 8 is fixed and attached to the component supply units 71, 72 and also, the tape feeder 8 is electrically connected to a control unit 24 (see FIG. 4) of the component mounting apparatus M4, M5.

A tape feeding unit 22 including a tape feeding mechanism for pitch feeding of the carrier tape 17 is built into the body portion 8a, and the tape feeding unit 22 includes a driving mechanism for rotating and driving a sprocket for tape feeding formed on the top of a tape travel path, and a feeder control unit 23 for controlling this driving mechanism. The carrier tape 17 pulled out of the supply reel 16 is fed by a pitch to a pickup position by the suction nozzle 12a of the mounting head 12 by the tape feeding unit 22. A feeder ID code for identifying and specifying the tape feeder 8 from the other tape feeders is stored in a storage device built into the feeder control unit 23, and the tape feeder 8 is attached to the feeder base 18 and thereby, the control unit 24 can individually identify each of the tape feeders 8.

That is, the component mounting system 1 of the embodiment includes feeder identification means for identifying the tape feeders 8 arranged in the component supply units 71, 72. In the embodiment, it is determined whether a work result of setup changeover work executed by a worker is correct or not based on an identification result of the feeder identification means. In the embodiment, the feeder identification means detects a feeder ID stored in each of the tape feeders 8. However, the present invention is not limited thereto, and the feeder identification means may allow a worker to manually read identification information such as a bar code, an IC tag, etc. provided on the supply reel 16 by a reader terminal device may be used.

Next, a configuration of a control system will be described with reference to FIG. 4. The host system 3 includes a main control unit 31 having a function as a management computer, and a main storage unit 32, and delivers and receives a control signal between the host system 3 and each apparatus configuring the component mounting system 1 through a communication unit 33. Each of the component mounting apparatuses M4, M5 connected to the communication network 2 through a communication unit 25 includes the control unit 24, a storage unit 26 and a collation processing unit 28. The control unit 24 is an arithmetic processing unit, and controls the substrate conveyance mechanism 5, the component mounting mechanism 13 and the component supply units 71, 72 based on production data 26a stored in the storage unit 26, that is, feeder arrangement data or mounting data stored for each substrate type targeted for production. Accordingly, mounting the electronic component picked up from each of the tape feeders 8 of the component supply units 71, 72 on the substrate 6, i.e., component mounting work, is executed.

A feeder detecting unit 27 provides a feeder detecting function implemented by reading the feeder ID stored in the feeder control unit 23 by the control unit 24. The collation processing unit 28 provides a function of comparing the feeder identification result detected for each of the feeder addresses 7a by the feeder detecting unit 27 with feeder data defined by the production data 26a, and performs collation to determine whether the tape feeder 8 attached to each of the feeder addresses 7a is a correct tape feeder 8 to be properly attached to the feeder address 7a. The manipulation/input unit 21 and the display unit 20 are provided on the manipulation unit 19 of the apparatus manipulation surface shown in FIGS. 3A and 3B, and perform display of various manipulation and guide screens or manipulations and data inputs necessary at the time of manipulation operation, respectively.

A setup changeover support apparatus 40 has a function of providing notification or various display screens which are indicated so as to efficiently easily execute setup changeover work such as an arrangement change of or replacement of the tape feeder 8 required in the component supply units 71, 72 with change of a type thereof targeted for production. The setup changeover support apparatus 40 includes a processing function unit of a work instruction information derivation processing unit 41, a feeder arrangement information storage unit 42, a work instruction information storage unit 43, an instruction information display processing unit 44, and a display screen 45. The feeder arrangement information storage unit 42 stores feeder arrangement information corresponding to an arrangement state of the tape feeder 8 arranged in the component supply units 71, 72.

The feeder arrangement information includes current feeder arrangement information 42a corresponding to a current arrangement state of the tape feeder 8 currently arranged in the component supply units 71, 72, and first feeder arrangement information 42b corresponding to a first arrangement state for producing a next substrate type (first substrate type). The work instruction information derivation processing unit 41 derives work instruction information which defines setup changeover work necessary to change the arrangement state of the tape feeder 8 in the component supply units 71, 72 from the current arrangement state to the first arrangement state based on the current feeder arrangement information 42a and the first feeder arrangement information 42b.

The derived work instruction information is stored in the work instruction information storage unit 43, and the instruction information display processing unit 44 reads the work instruction information from the work instruction information storage unit 43 and performs processing for displaying the work instruction information on the display screen 45 according to a predetermined display format. Accordingly, work instruction information 50 shown in FIG. 5 is displayed on the display screen 45, and a worker sequentially executes the setup changeover work according to the contents of display of the work instruction information 50.

As an example of the setup changeover support apparatus 40, the embodiment shows a standalone apparatus such as a personal computer having an independent processing arithmetic function and a storage device, but the embodiment of the invention is not limited thereto and may have various forms. For example, a function of the setup changeover support apparatus 40 may be included in the host system 3 to function as a setup changeover support processing unit 34.

Further, the function of the setup changeover support apparatus 40 may be annexed to each of the component mounting apparatuses M4, M5 to function as a setup changeover support processing unit 29. In this case, the display unit 20 provided on the apparatus manipulation surface may be used as the display screen 45. Of course, when the display unit 20 is used as the display screen 45 for displaying the work instruction information 50 even in the case of using the setup changeover support apparatus 40 as the standalone apparatus, the work instruction information 50 can be referred to in a position just near to the component supply units 71, 72, and workability can be improved.

Next, a data configuration of the work instruction information 50 will be described with reference to FIG. 5. In FIG. 5, the work instruction information 50 is prepared in each time the setup changeover work involved in change of a type of substrate targeted for production is to be executed, and is configured to display unit work information 50a for defining the contents of work to be executed for each of the tape feeders 8 targeted for work by a worker in the order of "work sequence" 51 to execute work. That is, the unit work information 50a includes various items of the "work sequence" 51, an "operation kind" 52, a "current state" 53, "next production" 54, a "component name" 55, a "reel" 56, "number of necessary components" 57 and a "comment" 58.

The "operation kind" 52 is kind information indicating a kind of execution operation executed in setup changeover work by the unit work information 50a. In the embodiment, "detachment" (see arrow b shown in FIG. 3B) indicating execution operation of detaching the already arranged tape feeder 8 in the component supply units 71, 72, "attachment" (see arrow a shown in FIG. 3B) indicating execution operation of newly arranging the tape feeder 8 in the component supply units 71, 72, and "movement" in which the tape feeder 8 is once detached from the component supply units 71, 72 and then is rearranged in another feeder address 7a as it is are defined as operation information.

In an example shown in FIG. 5, the pieces of unit work information 50a with the "work sequences" 51 of 1, 3, 4, 5 include "detachments" as execution operation, and the unit work information 50a with the "work sequence" 51 of 2 includes "movement" as the execution operation. Then, after the completion of the pieces of unit work information 50a including these "detachments" in the execution operation, the pieces of unit work information 50a using "attachment" as the execution operation are defined in the "work sequences" 51 of 6 and later. The execution operation always including the "detachment" is first displayed as precedence for the purpose of clearly instructing a worker on a reasonable work procedure and preventing confusion of the work procedure due to an error or a mistake.

That is, in the embodiment, the kind information for defining the "operation kind" 52 includes the "detachment" (first information) indicating the execution operation of detaching the already arranged tape feeder 8 in the component supply units 71, 72 and the "attachment" (second information) indicating the execution operation of newly arranging the tape feeder 8 in the component supply units 71, 72, and the work instruction information derivation processing unit 41 displays the pieces of unit work information 50a sorted by the "operation kind" 52 in display sequence in which the "attachment" is arranged next to the "detachment".

The "current state" 53 indicates a feeder state (the current status) before execution of work of the tape feeder 8 targeted for work, and the "next production" 54 indicates a feeder state (a status in the next production) after execution of work in the setup changeover work. For example, the unit work information 50a with the "work sequence" 51 of 1 indicates that the tape feeder 8 arranged in the feeder address 7a of 1-13R in the current state is targeted, and "detachment" from the component supply unit 71 or 72 is executed for the target tape feeder 8, and the tape feeder 8 should be temporarily kept integrally to the supply reel 16 in a work shelf etc. in the vicinity of the component mounting line 1a without detaching the supply reel 16 and the carrier tape 17 for reuse in the next production or later.

Also, the unit work information 50a with the "work sequence" 51 of 2 indicates that the tape feeder 8 attached to the feeder address 7a of 1-14L in the current state is once detached, and "movement" of reattachment to the feeder address 7a of 1-2L for the next production should be executed. Then, all the pieces of unit work information 50a with the "work sequences" 51 of 6 and later indicate that the "operation kind" 52 is "attachment" and herein, the "current state" 53 is "new", that is, the tape feeder 8 kept in a material depository etc. should be newly taken out and be attached and arranged to the feeder address 7a defined in the "next production" 54.

The "component name" 55 assigned to each unit work information 50a indicates a component name of an electronic component supplied by the tape feeder 8, and the "reel" 56 indicates a type of supply reel used in the tape feeder 8. Then, the "number of necessary components" 57 indicates the expected number of the number of components necessary in production subsequent to the next production. The "comment" 58 displays various pieces of instruction information secondarily necessary in setup changeover work, for example, a shelf number for specifying a position in which the detached tape feeder 8 is temporarily kept in the case of specifying "reuse" in the "next production" 54.

Next, a method for providing an instruction on the setup changeover work executed at the time of changing a type of product in the component mounting system 1 configured as described above will be described. First, before the start of mounting work, the current feeder arrangement information 42a and the first feeder arrangement information 42b are stored in the feeder arrangement information storage unit 42 for the purpose of creating work instruction information.

Next, the work instruction information derivation processing unit 41 derives work instruction information which defines setup changeover work necessary to change an arrangement state of the tape feeders 8 in the component supply units 71, 72 from the current arrangement state to the first arrangement state based on the current feeder arrangement information 42a and the first feeder arrangement information 42b (a work instruction information deriving step), and the derived work instruction information is stored in the work instruction information storage unit 43. Then, the work instruction information shown in FIG. 5 is displayed on the display screen 45 by the instruction information display processing unit 44 (an instruction information display step).

Here, the work instruction information 50 includes a plurality of pieces of unit work information 50a. Each of the pieces of unit work information 50a includes a combination of the "operation kind" 52 serving as kind information indicating a kind of execution operation described above in association with the "current state" 53 and the "next production" 54 serving as feeder state information indicating states before and after execution of work on the tape feeder 8 targeted in the setup changeover work. Then, in the instruction information display step, the plurality of pieces of unit work information 50a are displayed on the display screen 45 so as to be arranged in work sequence to be executed.

The "operation kind" 52 includes "detachment" indicating the execution operation of detaching the already arranged tape feeder 8 in the component supply unit 71 or 72 and "attachment" indicating the execution operation of newly arranging the tape feeder 8 in the component supply unit 71 or 72. Then, in the instruction information display step, the display is formed such that the pieces of unit work information 50a sorted by kind information in display sequence in which the "attachment" is arranged next to the "detachment" in the operation kind.

The component mounting apparatuses M4, M5 of the component mounting line 1a include the feeder identification means for identifying the tape feeders 8 arranged in the component supply units 71, 72 as described above. In the embodiment, if the feeder identification means detects that a work result of executed setup changeover work differs from the displayed work instruction information 50 using this function, unit work information 50a necessary to modify the work result to a correct work result based on the work instruction information 50 is newly derived and additionally displayed on the display screen 45.

Next, effects and advantages and a display form of the work instruction information 50 in a process of execution of setup changeover work will be described with reference to FIGS. 6A and 6B. In setup changeover work of executing an arrangement change or replacement of the tape feeder 8 in the component supply unit 71 or 72, a worker refers to the displayed work instruction information 50 and sequentially executes the work defined in each unit work information 50a in sequence defined in the "work sequence" 51 as described above.

During execution of the work, the control and detection functions of each of the component mounting apparatuses M4, M5 executes, in real time, identification and detection of attachment and detachment of the tape feeder 8 in each of the feeder addresses 7a of the component supply units 71, 72. The results of the identification and detection of attachment and detachment are transmitted to the setup changeover support apparatus 40, and the setup changeover support apparatus 40 displays a work progress state of the setup changeover work on the work instruction information 50 in real time as shown in FIG. 6A.

An example shown in FIG. 6A indicates that the work of the inside of an inclusion frame 50A (display by color, hatching, etc.) including the unit work information 50a with "detachment" among the plurality of pieces of unit work information 50a has already been executed. Then, in the pieces of unit work information 50a already executed, display of the "reel" 56, the "number of necessary components" 57 and the "comment" 58 is omitted since the tape feeders 8 are detached from the component supply unit 71 or 72.

Also, the example shown in FIG. 6A indicates that the plurality of pieces of unit work information 50a shown in an inclusion frame 50B of a broken line are in use for component mounting work for the current substrate type. That is, the example indicates that during execution of the component mounting work of the current substrate type, it is not possible to start setup changeover work of the feeder addresses 7a (herein, 1-10L, 1-13L, 1-14L) to which the tape feeders 8 targeted for the setup changeover work are attached. After the completion of automatic running of the component mounting work, setup changeover work of these pieces of unit work information 50a can be executed. By the display, a work mistake due to an error is prevented and also, a setup changeover for the next production can be prepared and work efficiency can be improved.

In the work instruction information 50 shown in the embodiment, "reuse" is displayed as the "current state" 53 and the "next production" 54 as shown in FIG. 6B. By displaying "reuse" (see a broken line frame 54A) for a component reused in future production in association with an instruction on "detachment," the tape feeder 8 targeted for the "detachment" can be temporarily kept without detaching the supply reel 16 from the tape feeder 8 and returning the supply reel 16 to a component warehouse.

When the temporarily kept tape feeder 8 described above is reattached in an instruction on "attachment," by displaying "reuse" (see a broken line frame 53A) in the "current state" 53, it is easily indicate that a worker can reuse the already kept tape feeder 8, and effort to newly find the tape feeder 8 and the supply reel 16 can be reduced.

Also, by assigning the "number of necessary components" 57 (see a broken line frame 57A) to the pieces of unit work information 50a with the "operation kind" 52 of "attachment", the number of reels or the number of components necessary for the component type can be predicted to easily execute component preparatory work.

In instructions on setup changeover work in the component mounting system shown in the embodiment as described above, the work instruction information 50 defining setup changeover work necessary to change an arrangement state of the tape feeders 8 in the component supply unit 71 or 72 from the current arrangement state of the currently arranged tape feeders 8 to a first arrangement state for a first substrate type to be next produced is derived based on the current feeder arrangement information corresponding to the current arrangement state and the first feeder arrangement information corresponding to the first arrangement state, and the derived work instruction information 50 is displayed on the display screen 45. Further, the plurality of pieces of unit work information 50a each of which includes a combination of kind information indicating a kind of execution operation in the setup changeover work in association with feeder state information indicating states before and after execution of work on the tape feeder 8 targeted in the setup changeover work are displayed on the display screen so as to be arranged in the work sequence 51. Accordingly, the setup changeover work executed at the time of changing a type of product can be executed efficiently and easily.

A component mounting system and a method for providing an instruction on setup changeover work in the component mounting system of the embodiment of the invention have an effect capable of efficiently and easily executing the setup changeover work at the time of changing a type of product, and can be used in the field of manufacturing a mounting substrate in which an electronic component is mounted on a substrate.

This application is based on Japanese Patent Application No. 2013-157374, filed Jul. 30, 2013, the entire contents of which are incorporated herein by reference.

What is claimed is:

1. A method for providing an instruction on setup changeover work executed at changing a type of product in a component mounting system which produces a mounting substrate by mounting an electronic component on a substrate by a component mounting apparatus comprising a component supply unit in which a plurality of parts feeders for supplying components are arranged, and a component mounting mechanism which picks up the electronic component from the component supply unit and conveys and places the electronic component on the substrate, said method comprising:
storing feeder arrangement data including current arrangement information corresponding to a current arrangement state of the parts feeders currently arranged in the component supply unit and first arrangement information corresponding to a first arrangement state for a first substrate type scheduled to be produced;
deriving, from the stored current arrangement data and the stored first arrangement data, work instruction information which defines setup changeover work necessary to change an arrangement state of the parts feeders in the component supply unit from the current arrangement state to the first arrangement state based on the current feeder arrangement information and the first feeder arrangement information; and
displaying the derived work instruction information on a display screen,
wherein the work instruction information comprises a plurality of pieces of unit work information,
wherein each of the plurality of pieces of unit work information includes kind information and feeder state information,
wherein the kind information indicates a kind of execution operation in the setup changeover work,
wherein the feeder state information indicates states before and after execution of work on the parts feeder targeted in the setup changeover work,
wherein the plurality of pieces of unit work information are displayed on the display screen so as to be arranged in work sequence to be executed,
wherein the component mounting system comprises a feeder identification unit which identifies the parts feeder arranged in the component supply unit, and
wherein if the feeder identification unit detects that a work result of the executed setup changeover work differs from the displayed work instruction information, unit work information necessary to modify the work result to a correct work result based on the work instruction information is newly derived and additionally displayed on the display screen.

2. A method for providing an instruction on setup changeover work executed at changing a type of product in a component mounting system which produces a mounting substrate by mounting an electronic component on a substrate by a component mounting apparatus comprising a component supply unit in which a plurality of parts feeders for supplying components are arranged, and a component mounting mechanism which picks up the electronic component from the component supply unit and conveys and places the electronic component on the substrate, said method comprising:
deriving work instruction information which defines setup changeover work necessary to change an arrangement state of the parts feeders in the component supply unit from a current arrangement state of the parts feeders currently arranged in the component supply unit to a first arrangement state for a first substrate type scheduled to be produced based on current feeder arrangement information corresponding to the current arrangement state and first feeder arrangement information corresponding to the first arrangement state; and
displaying the derived work instruction information on a display screen,
wherein the work instruction information comprises a plurality of pieces of unit work information,
wherein each of the plurality of pieces of unit work information includes kind information and feeder state information,
wherein the kind information indicates a kind of execution operation in the setup changeover work,
wherein the feeder state information indicates states before and after execution of work on the parts feeder targeted in the setup changeover work,
wherein the plurality of pieces of unit work information are displayed on the display screen so as to be arranged in work sequence to be executed,
wherein the kind information comprises first information indicating execution operation of detaching an already arranged parts feeder in the component supply unit and second information indicating execution operation of newly arranging a parts feeder in the component supply unit, and wherein the pieces of unit work information are sorted by the kind information so as to be displayed in display sequence in which the unit work information containing the second information is arranged next to the unit work information containing the first information.

3. A component mounting system which produces a mounting substrate by mounting an electronic component on a substrate by a component mounting apparatus comprising a component supply unit in which a plurality of parts feeders for supplying components are arranged, and a component mounting mechanism which picks up the electronic component from the component supply unit and conveys and places the electronic component on the substrate, said component mounting system comprising:
 a storage unit which stores feeder arrangement data including current arrangement information corresponding to a current arrangement state of the parts feeders currently arranged in the component supply unit and first arrangement information corresponding to a first arrangement state for a first substrate type scheduled to be produced;
 a work instruction information deriving unit which derives, from the stored current arrangement data and the stored first arrangement data, work instruction information which defines setup changeover work necessary to change an arrangement state of the parts feeders in the component supply unit from the current arrangement state of the parts feeders to the first arrangement state based on the current feeder arrangement information and the first feeder arrangement information; and
 an instruction information display unit which displays the derived work instruction information on a display screen,
 wherein the work instruction information comprises a plurality of pieces of unit work information,
 wherein each of the plurality of pieces of unit work information includes kind information and feeder state information,
 wherein the kind information indicates a kind of execution operation in the setup changeover work,
 wherein the feeder state information indicates states before and after execution of work on the parts feeder targeted in the setup changeover work,
 wherein the plurality of pieces of unit work information are displayed on the display screen so as to be arranged in work sequence to be executed,
 wherein the component mounting system comprises a feeder identification unit which identifies the parts feeder arranged in the component supply unit, and
 wherein if the feeder identification unit detects that a work result of the executed setup changeover work differs from the displayed work instruction information, work instruction information deriving unit newly derives unit work information necessary to modify the work result to a correct work result based on the work instruction information so as to additionally display the newly derived unit work information on the display screen.

4. A component mounting system which produces a mounting substrate by mounting an electronic component on a substrate by a component mounting apparatus comprising a component supply unit in which a plurality of parts feeders for supplying components are arranged, and a component mounting mechanism which picks up the electronic component from the component supply unit and conveys and places the electronic component on the substrate, said component mounting system comprising:
 a work instruction information deriving unit which derives work instruction information which defines setup changeover work necessary to change an arrangement state of the parts feeders in the component supply unit from a current arrangement state of the parts feeders currently arranged in the component supply unit to a first arrangement state for a first substrate type scheduled to be produced based on current feeder arrangement information corresponding to the current arrangement state and first feeder arrangement information corresponding to the first arrangement state; and
 an instruction information display unit which displays the derived work instruction information on a display screen,
 wherein the work instruction information comprises a plurality of pieces of unit work information,
 wherein each of the plurality of pieces of unit work information includes kind information and feeder state information,
 wherein the kind information indicates a kind of execution operation in the setup changeover work,
 wherein the feeder state information indicates states before and after execution of work on the parts feeder targeted in the setup changeover work,
 wherein the plurality of pieces of unit work information are displayed on the display screen so as to be arranged in work sequence to be executed,
 wherein the kind information comprises first information indicating execution operation of detaching an already arranged parts feeder in the component supply unit and second information indicating execution operation of newly arranging a parts feeder in the component supply unit, and
 wherein the instruction information display unit sorts the pieces of unit work information by the kind information, and displays the sorted pieces of unit work information in display sequence in which the unit work information containing the first information is arranged prior to the unit work information containing the second information.

* * * * *